(12) United States Patent
Cheng

(10) Patent No.: US 12,395,144 B2
(45) Date of Patent: Aug. 19, 2025

(54) CABLE MODULE

(71) Applicant: Xiang Yao Electronics (Shenzhen) Co., Ltd., Shenzhen (CN)

(72) Inventor: Chih Wen Cheng, Hanchuan (CN)

(73) Assignee: Xiang Yao Electronics (Shenzhen) Co., Ltd., Shenzhen (CN)

( * ) Notice: Subject to any disclaimer, the term of this patent is extended or adjusted under 35 U.S.C. 154(b) by 194 days.

(21) Appl. No.: 18/137,545

(22) Filed: Apr. 21, 2023

(65) Prior Publication Data

US 2023/0352215 A1    Nov. 2, 2023

(30) Foreign Application Priority Data

Apr. 29, 2022   (CN) .......................... 202210473599.5

(51) Int. Cl.

| | |
|---|---|
| H03H 7/12 | (2006.01) |
| H01B 13/32 | (2006.01) |
| H01Q 1/44 | (2006.01) |
| H03H 7/46 | (2006.01) |
| H03H 7/48 | (2006.01) |
| H04B 1/10 | (2006.01) |
| H03H 7/01 | (2006.01) |

(52) U.S. Cl.
CPC ............... *H03H 7/12* (2013.01); *H01B 13/32* (2013.01); *H01Q 1/44* (2013.01); *H03H 7/468* (2013.01); *H03H 7/487* (2013.01); *H04B 1/1027* (2013.01); *H03H 2007/013* (2013.01); *H04B 2001/1063* (2013.01)

(58) Field of Classification Search
CPC .. H03H 7/12; H03H 7/00; H03H 7/01; H03H 7/0138; H03H 7/0153; H03H 7/468; H03H 7/487; H03H 2007/013; H03B 13/00; H03B 13/06; H03B 13/04; H03B 13/32; H04B 1/10; H04B 1/1027
USPC .................................. 333/12, 172, 175, 176
See application file for complete search history.

(56) References Cited

U.S. PATENT DOCUMENTS

| | | | |
|---|---|---|---|
| 11,398,807 B2 * | 7/2022 | Liu .......................... | H04B 1/40 |
| 11,929,536 B2 * | 3/2024 | Han ................... | H01B 11/1826 |

* cited by examiner

*Primary Examiner* — Hai L Nguyen
(74) *Attorney, Agent, or Firm* — Piloff Passino & Cosenza LLP; Rachel Piloff; Sean Passino

(57) ABSTRACT

Disclosed is a cable module comprising a cable and a notch filter including a metal foil and a plurality of capacitors, wherein the metal foil is wrapped around the cable, wherein the metal foil includes a first through section and a second through section respectively arranged on opposite sides of the cable For an antenna to be placed in the through sections to capture frequency signals of the core wire by connecting to the detection device, and then the frequency signals can be collected and transmitted to the detection device for comparison and analysis, allowing for the detection of defective product. Thus, the said design eliminates the need for cumbersome disassembly of the notch filter product before detection thereof, thereby streamlining the detection process and making cable testing more efficient and precise.

10 Claims, 3 Drawing Sheets

CABLE MODULE

CROSS-REFERENCE TO RELATED APPLICATIONS

This application claims priority to Chinese Invention Application No. 202210473599.5, filed on Apr. 29, 2022. The disclosure of the application is incorporated herein for all purposes by reference in its entirety.

TECHNICAL FIELD

The present disclosure relates to a cable module, in particular to a cable module comprising a notch filter.

BACKGROUND ART

The Chinese patent application No. 201510443621.1 discloses that the medical cable used in nuclear magnetic resonance equipment includes a notch filter (also known as a band stop filter) with an adjustable capacitance. The reason for providing an adjustable capacitance is that the notch filter may have capacitance value deviations during manufacturing, caused by variations in the length of the metal foil, process deficiencies; or variations due to prolonged usage, thereby resulting in differences in the frequencies that the filter can effectively filter.

To determine whether there are such differences in the notch filter, it is necessary to perform detection tests on the cables. The common detection method in the prior art is to connect both ends of the cable to a network analyzer for detection. However, this detection method imposes strict requirements on the types of connections and the connection strength between the product and the detection equipment. As a result, the detection process can be quite intricate and time-consuming, leading to high detection costs.

TECHNICAL SOLUTION

To overcome the limitations of current technology, the present disclosure provides a cable module, which comprises not only a notch filter on the exterior of the cable, but the metal foil, surrounding the outermost of the notch filter, having two through sections, each of the through sections penetrates to the insulating layers of the cable. By placing the transmitting antennas and receiving antennas in the two through sections, it is possible to detect the frequency signals of the core wire and the signal can be transmitted to the testing equipment for signal comparison and determination of differences. This design enables the detection process to be done wirelessly, avoiding the cumbersome disassembly and reassembly process of the notch filter before testing. The design of the notch filter may simplify the testing steps and makes the testing of cable with notch filter more efficient and accurate.

DESCRIPTION OF DRAWINGS

The present disclosure will be further illustrated below in conjunction with the accompanying drawings and embodiments.

LIST OF REFERENCE SIGNS

1 cable; 10 conductor; 11 insulation layer; 11A recessed space; 2 notch filter; 22 metal foil; 22A first through section; 22B second through section; 23 capacitor; 231 fixed-value capacitor; 232 variable-value capacitor; 232A adjustment interface; 24 circuit board; 241 front circuit board; 242 rear circuit board; 3 detection element group; 31 transmitting antenna; 32 receiving antenna; 4 electrically insulated cover.

Mode for Invention

The following embodiments, along with the accompanying drawings, provide a clear and comprehensive explanation of the concept, specific structure, and technical effect of the present disclosure, thus facilitating a full understanding of the purpose, features, and effects of the present disclosure. It should be appreciated that the embodiments described herein are only a part of the possible embodiments of the present disclosure, rather than the entirety of them. Other embodiments of the present disclosure that can be obtained by those skilled in the art, without any additional creative efforts based on the embodiments described herein, are also within the scope of protection of the present disclosure. Additionally, all the coupling/connection relationships referred to herein do not necessarily pertain to the direct connection of components, but rather to the possibility of creating a more optimal connection structure by adding or removing connecting accessories based on specific implementation scenarios. The various technical features disclosed herein can be combined with each other as long as they do not conflict with or contradict each other.

Figure 1:
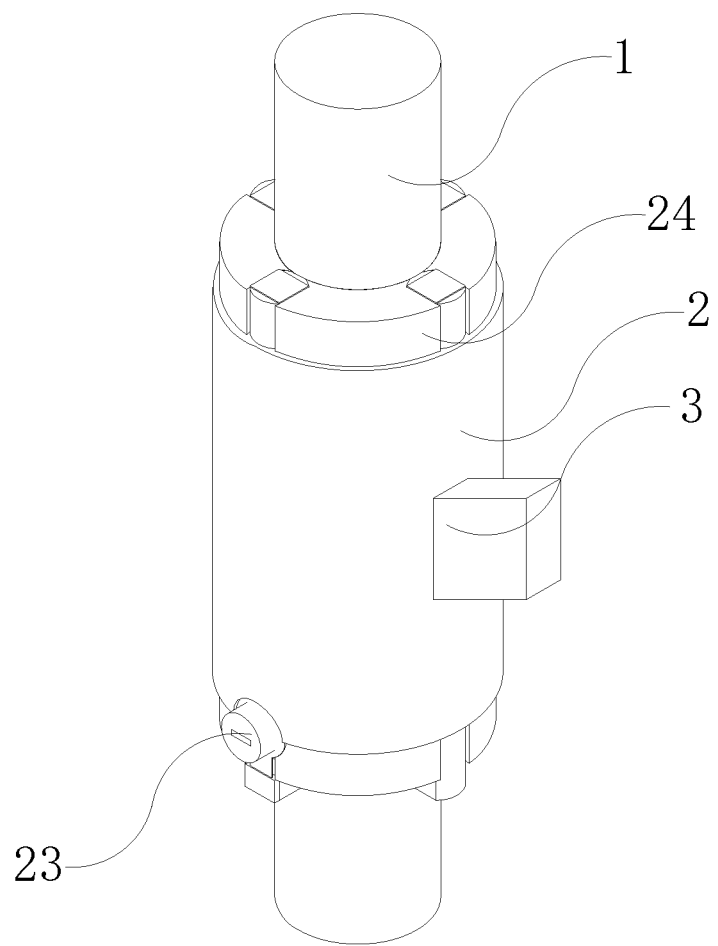
FIG. 1 is a schematic diagram of assembly of a cable module of the present disclosure.
Figure 2:
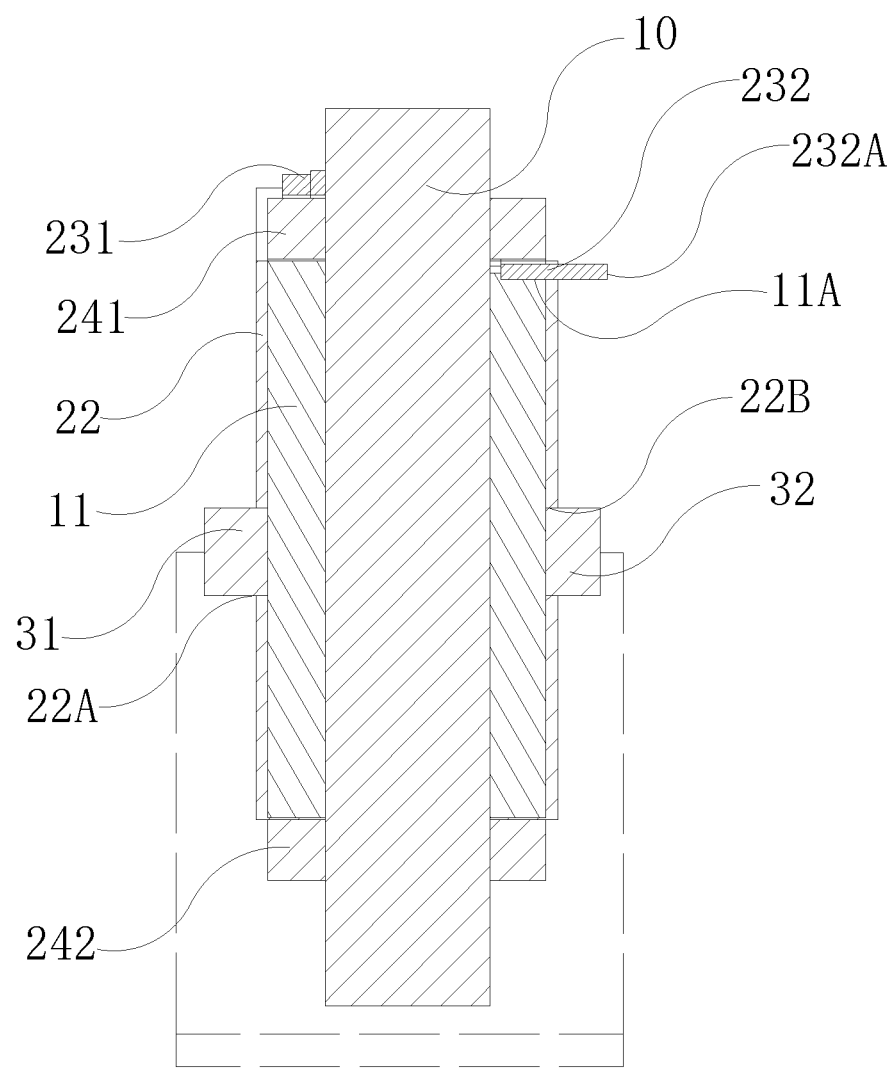
FIG. 2 is a schematic cross-sectional view of a cable module without an insulating envelope structure of the present disclosure.

FIGS. 1 and 2 show a cable module of an embodiment comprising a cable 1 and a notch filter 2 arranged outside of the cable 1.

The design of the cable 1 is generally identical to the medical cables used in Nuclear Magnetic Resonance (NMR) equipment, which includes at least a conductor 10 and an insulation layer 11 wrapped around the conductor 10. In an embodiment, the conductor 10 is a solid metal copper wire or a core wire formed by twisting multiple thin copper wires. The insulation layer 11 is wrapped around the conductor 10, which may be various common insulating materials such as ABS. When "Unit A" is wrapped around "Unit B", it means that "Unit A" surrounds and covers "Unit B", regardless of whether there are any other substances between "Unit A" and "Unit B". Therefore, "Unit A" and "Unit B" are not necessarily in direct contact. The notch filter 2 mainly includes elements such as a metal foil 22, a plurality of capacitors 23, a front circuit board 241, and a rear circuit board 242.

The metal foil 22 is made of conductive metal, such as copper. The metal foil 22 includes a first through section 22A and a second through section 22B. In an embodiment, the first through section 22A and the second through section 22B are represented as through holes penetrating the inner and outer sides of the metal foil 22. Alternatively, if needed, the first through section 22A and the second through section 22B can be both end portions of a common elongated groove penetrating through the metal foil 22.

The plurality of capacitors 23 may either be fixed-value capacitors 231 or variable-value capacitors 232. In an embodiment, each notch filter 2 comprises four capacitors 23 arranged at equal intervals, and the conductor 10 is located at the center of the circles defined by the four capacitors 23, among which three are fixed-value capacitors 231 and one is a variable-value capacitor 232.

The variable-value capacitor 232 has an adjustment interface 232A, located at, for example, the top side of the variable-value capacitor 232. The adjustment interface 232A can be either a groove type or a knob type interface. The groove type interface allows a screwdriver to be inserted and rotated for capacitance value adjustment, while the knob type allows users to grip and rotate it directly without any tools. In addition, the variable-value capacitor 232 is not necessary, and the capacitor 23 can be all fixed-value capacitor 231 when needed.

After assembly, the insulation layer 11 of the cable 1 and the metal foil 22 are wrapped outside of the insulation layer 11 to form a cylindrical structure, thus the metal foil 22 surrounds and covers at least a portion of cable therein. Meanwhile, two circuit boards 24 are fixed at the both ends of the cylindrical structure. The circuit boards 24 can be called the front circuit board 241 and the rear circuit board 242 based on their respective positions. The front circuit board 241 and the rear circuit board 242 can be electrically connected to the conductor 10 respectively.

The front circuit board 241 has two opposite working surfaces with circuit and contact pads, one working surface is on the top and the other is on the bottom surface thereof.

In an embodiment, the fixed-value capacitor 231 and the variable-value capacitor 232 are respectively fixed on two different working surfaces of the circuit board 24, and the plurality of capacitors 23 are electrically insulated from the circuit board 24. Alternatively, the fixed-value capacitor 231 and the variable-value capacitor 232 can also be placed on the same working surface formed thereon when needed. In addition, one end of the insulation layer 11 corresponding to the front circuit board 241 has a recessed space 11A for the variable-value capacitor 232 fixed onto the circuit board 24 to be disposed therein. The metal foil 22 is electrically connected to the conductor 10 in the cable 1 via the capacitors 23.

In this way, the capacitance value provided by the metal foil 22 between the metal foil 22 and the cable 1 can be adjusted, such that the frequency of cable 1 can be adjusted conveniently by the adjustment of the variable-value capacitor 232 when the cable 1 produces loss, thereby enhancing the convenience of frequency adjustment for cable 1.

In summary, the frequency offset of the notch filter 2 can be adjusted by the design of metal foil 22 and capacitors 23 which located at the periphery of the cable 1, which also eliminates the need to trim the metal foil 22 when the cable 1 experiences frequency offset due to various reasons, thereby improving the product yield. More specifically, the metal foil 22 and the capacitor 23 are electrically connected either by wires welded on their surfaces or by direct contact, and the plurality of capacitors 23 and the conductor 10 are, for example, directly electrically connected by solder.

In addition, in the final product, the first through section 22A and the second through section 22B on the metal foil 22 are respectively arranged on opposite sides of the cable 1. The insulation layer 11 is exposed through the first through section 22A and the second through section 22B, that is, the insulation layer 11 is not covered by the first through section 22A and the second through section 22B. In other word, the insulation layer 11 of the cable 1 blocks the bottoms of the first through section 22A and the second through section 22B, or say, insulation layer 11 closes off or covers up the bottom of the first through section 22A and the second through section 22B. The first through section 22A and the second through section 22B are located on opposite sides of the cable 1. And the space, along the shortest direct path, between the first through section 22A and the second through section 22B has no metal foil 22 be placed therein. In this way, the first through section 22A and the second through section 22B allow detection element set 3 to be embedded therein respectively for detection.

The detection element set 3 may include at least a transmitting antenna 31 and a receiving antenna 32 facing each other. The transmitting antenna 31 and the receiving antenna 32 create a pathway for signal transmission and reception, therefore, by connecting the antennas to a detection device, any capacitance offset caused by stripping of metal foil 22 can be detected, and the capacitance value thereof can be adjusted accordingly by variable-value capacitor 232 or replace with another fixed value capacitor of corresponding capacitance value.

The transmitting antenna 31 and receiving antenna 32 can form an induction loop with cable 1 located therebetween. When the transmitting antenna 31 and the receiving antenna 32 are connected to an external detection device, it is possible to directly detect whether the frequency of the cable 1 is decreased by comparing the received and transmitted signals, and then adjust it through a variable-value capacitor. Compared to using the network analyzer directly connected to the cable 1, this detection process saves a significant number of operational steps, simplifies the testing method, and saves both manpower and resources. Moreover, the transmitting antenna 31 and receiving antenna 32 may be a capacitor plate respectively.

It should be noted that, except for the cable 1, no metal material should be disposed within the space between the first through section 22A and the second through section 22B to prevent error of the detection result of the magnetic induction.

Moreover, the transmitting antenna 31 and the receiving antenna 32 may optionally be pre-embedded in the first through section 22A and the second through section 22B, respectively, and be a part of the notch filter 2. By using a pair of detection probes connected to a conductive pad of the transmitting antenna 31 and the receiving antenna 32, a circuit can be formed.

Alternatively, the transmitting antenna 31 and the receiving antenna 32 can be pre-connected with the detection device are placed in the first through section 22A and the second through section 22B only if testing is needed, and then removed after the detection is completed.

Figure 3:
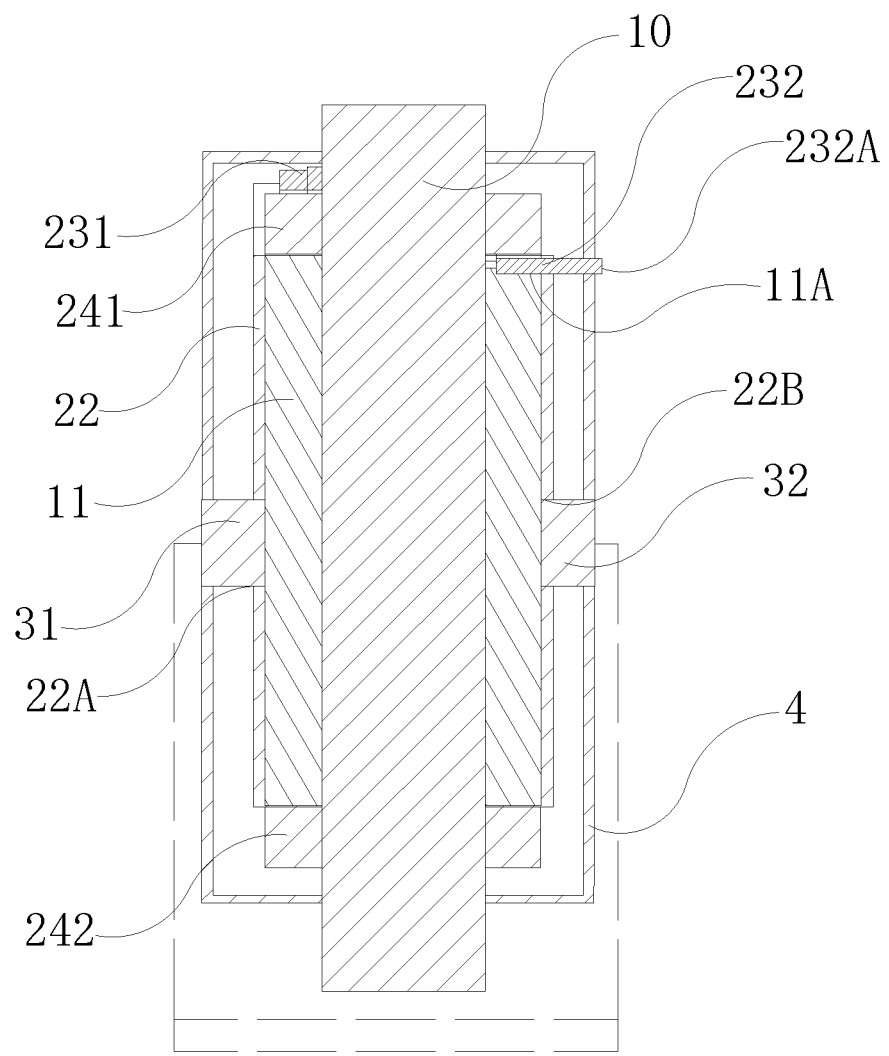
FIG. 3 is a schematic cross-sectional view of a cable module with an insulating envelope structure of the present disclosure.

Referring to FIG. 3, the exterior of the cable and the metal foil 22 further includes an electrically insulated cover 4. A side opening 41 can be selectively provided on the electrically insulated cover 4 corresponding to the variable-value capacitor 232, which allows the adjustment interface 232A of the variable-value capacitor 232 to be exposed from the side opening 41 of the electrically insulated cover 4, thereby enabling the user to adjust the adjustment interface 232A. Alternatively, the electrically insulated cover 4 may not include the side opening 41 so as to cover the entire notch filter 2 and a part of the cable 1. In addition, an opening may also be selectively provided on the electrically insulated cover 4 corresponding to the first through section 22A and the second through section 22B, for the antenna or probe to pass through. In this way, the capacitance value can be adjusted without dismantling the electrically insulated cover 4, which makes the operation more convenient. The electrically insulated cover can be an assembled hollow plastic shell formed of multiple parts. Alternatively, the electrically insulated cover may also be a heat-shrinkable sleeve or similar materials with protection functions.

The foregoing description has provided specific details regarding preferred embodiments of the present disclosure. However, it should be appreciated that the present disclosure is not limited to the embodiments disclosed herein, those skilled in the art may make various equivalent modifications or variants without departing from the essence of the present disclosure, and such modifications or variants are also encompassed within the scope of the claims of the present disclosure.

The invention claimed is:

1. A cable module, comprising:
a cable including a conductor and an insulation layer wrapped around the conductor; and
a notch filter including a metal foil and a plurality of capacitors,
wherein
the metal foil surrounds at least a part of the cable, the metal foil and the conductor are electrically connected via the plurality of capacitors, the metal foil includes a first through section and a second through section respectively located on opposite sides of the cable, and the first through section and the second through section respectively penetrates the metal foil.

2. The cable module according to claim 1, wherein the first through section and the second through section are through holes penetrating the metal foil, and the insulation layer of the cable covers up bottoms of the first through section and the second through section.

3. The cable module according to claim 2, wherein the metal foil are not positioned in a space between the first through section and the second through section.

4. The cable module according to claim 3, wherein the notch filter further comprises a circuit board, wherein the plurality of capacitors includes at least one fixed-value capacitor and at least one variable-value capacitor, the fixed-value capacitor is arranged on a working surface of the circuit board, and the variable-value capacitor is arranged on another working surface, and the plurality of capacitors and the circuit board are electrically insulated from each other.

5. The cable module according to claim 4, wherein the insulation layer has a recessed space for the variable-value capacitor on the circuit board to be disposed therein.

6. The cable module according to claim 5, further comprises an electrically insulated cover, wherein the electrically insulated cover covers a whole of the notch filter and a part of the cable.

7. The cable module according to claim 6, wherein the electrically insulated cover includes a shell, which is an assembled hollow plastic shell.

8. The cable module according to claim 5, further comprises an electrically insulated cover for accommodating the node filter, wherein the variable-value capacitor is provided with an adjustment interface, and the shell includes a side opening, and the adjustment interface is exposed through the shell through section.

9. The cable module according to claim 1, further comprises a transmitting antenna and a receiving antenna, wherein the transmitting antenna is disposed in the first through section, and the receiving antenna is disposed in the second through section.

10. The cable module according to claim 9, wherein the transmitting antenna and the receiving antenna is a capacitor plate respectively and arranged to face each other.

* * * * *